United States Patent [19]

Gratze

[11] Patent Number: 4,565,983
[45] Date of Patent: Jan. 21, 1986

[54] FILTER

[75] Inventor: Stephen C. Gratze, Boreham, England

[73] Assignee: The Marconi Company Limited, Stanmore, England

[21] Appl. No.: 493,561

[22] Filed: May 11, 1983

[30] Foreign Application Priority Data

May 12, 1982 [GB] United Kingdom ............... 8213759

[51] Int. Cl.⁴ .................... H03H 9/64; G02B 5/172
[52] U.S. Cl. ................................ 333/193; 333/195; 350/162.11; 350/358
[58] Field of Search ............... 333/150–155, 333/193–196, 187; 310/313 R, 313 A, 313 B, 313 C, 313 D, 311, 364–366; 350/162.11, 162.12, 162.13, 162.14

[56] References Cited

U.S. PATENT DOCUMENTS 4,415,226 11/1983 Verber et al. .............. 350/162.3
4,467,276 8/1984 Marten et al. .............. 324/77 R

FOREIGN PATENT DOCUMENTS 2100858 1/1983 United Kingdom .

Primary Examiner—Marvin L. Nussbaum
Attorney, Agent, or Firm—Spencer & Frank

[57] ABSTRACT

The invention uses acousto-optic interaction and a spatial light modulator to provide a filter whose characteristics can be rapidly changed.

An input signal is applied to an electro-acoustic transducer which launches surface acoustic waves along a lithium niobate block. The frequency of the acoustic waves depends on the frequency of the input signal. The acoustic waves interact with light from a laser to deflect the light by an angle depending on their frequency. The deflected light is incident on a spatial light modulator, controlled by control signals so as to determine the relationship between the translucency of the filter and the position in a direction perpendicular to the optical path. This relationship can be a simple one such that light is transmitted only through certain paths of the filter or can be more complex. The spatial filter thus filters by different amounts light modulated by input signals on different carrier frequencies. The light, thus filtered, is then converted back into electrical signals.

5 Claims, 3 Drawing Figures

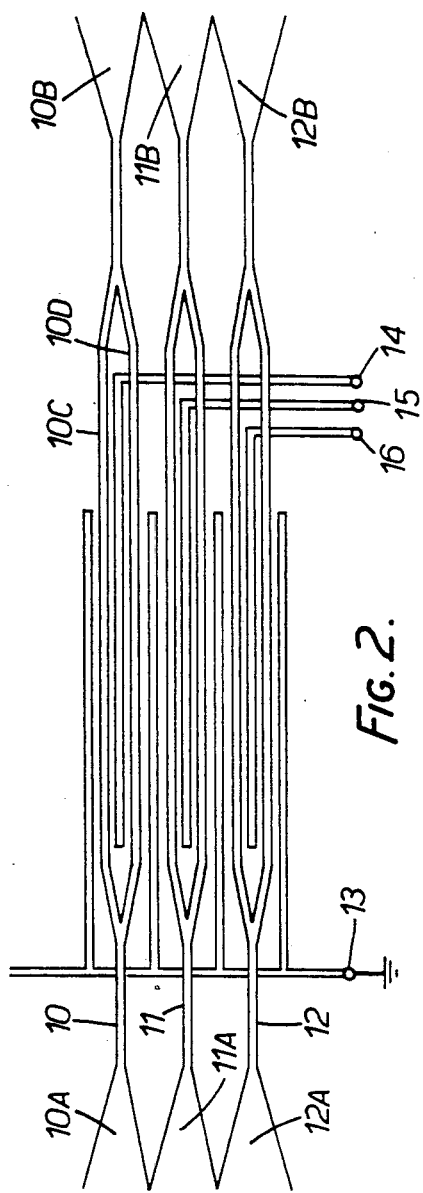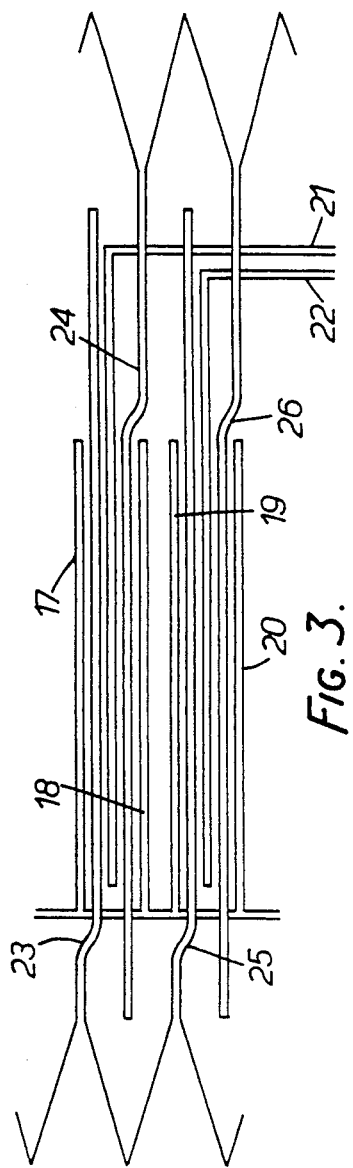
Fig. 2.
Fig. 3.

FILTER

BACKGROUND OF THE INVENTION

This invention relates to a filter and more particularly, to a filter which can be readily adapted to change its characteristics as the need arises.

SUMMARY OF THE INVENTION

It is an object of the invention to provide rapidly agile R.F. filtering with arbitrary spectral shape which is particularly useful for frequency agile communication and radar systems, permitting either limited bandwidth agile jamming signals to be excized or agile wanted signals to be adaptively filtered from wideband interference.

With a view to meeting the above and other objects, the invention provides a filter comprising a device for deflecting a light beam by an amount dependent on the frequency of an input signal and a spatial light modulator whose spatial modulation characteristics can be changed by changing control signals to it. The spatial light modulator is arranged to receive the deflected light and to distinguish between light deflected through different angles so that it transmits light modulated in response to input signal components having a particular frequency characteristic defined by the control signals.

Preferably the filter includes means for producing surface waves and propagating them along the surface of a single piece of material, the device for deflecting a light beam and the spatial light modulator being formed on the said surface. Surface acoustic waves or surface skimming bulk waves may be employed, enabling components of the filter to be integrated on to the single piece of material. Lithium niobate is a material which is well suited to such an application.

References in this Specification to "light" should be taken to include infra-red, visible and ultra-violet electromagnetic radiation.

BRIEF DESCRIPTION OF DRAWINGS

FIG. 2 illustrates a spatial light modulator which can be used as an alternative to that shown at 7 on FIG. 1, and;

FIG. 3 shows another spatial light modulator which can be used as an alternative to that shown at 7 on FIG. 1.

DETAILED DESCRIPTION

Figure 1:
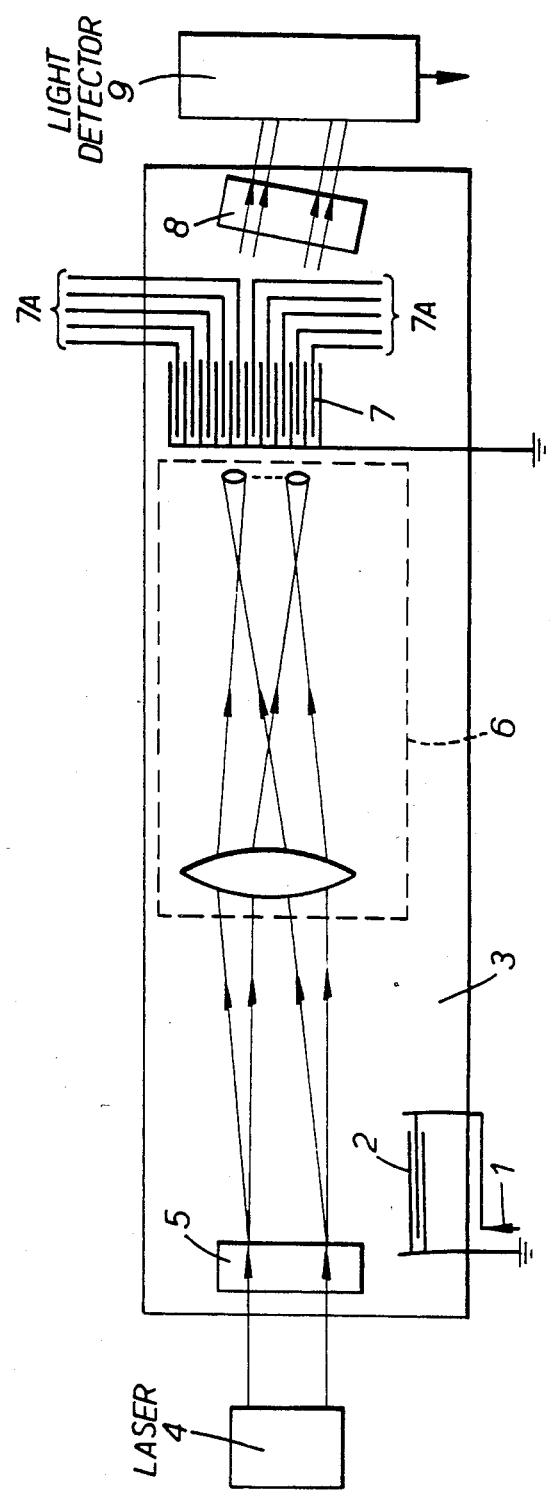
FIG. 1 shows apparatus in accordance with the invention.

The purpose of the illustrated apparatus is to filter R.F. signal frequencies to pass one or more particular frequency bands or to attenuate different frequency components by respective different amounts in any desired way. The signal may be amplitude or frequency modulated.

The input signal is entered at 1 and applied to an electro-acoustic transducer 2, which is shown schematically as a single set of interdigitated electrodes but which is in fact, a more complex structure designed to steer an acoustic beam in different directions according to the input frequency so as to ensure that the acoustic waves undergo Bragg interaction with light emitted by a laser to be described later. The transducer 2 is attached to the surface of the lithium niobate block 3 which allows acoustic and electromagnetic waves to propagate through it. They can interact with each other because of its electro-optic properties. The top surface of the block 3 has titanium diffused in it to form a light guide.

The signal applied to the transducer 2 results in surface acoustic waves being launched, the wavelengths depending on the frequency of the signal, and travelling across the block 3. Alternative embodiments may utilise surface skimming bulk waves.

A laser 4 produces monochromatic light which is coupled into the light guide layer of the block 3 by a prism 5. The light interacts with the acoustic waves where their paths meet. Some of the light is deflected by an angle according to the frequency of the acoustic waves, and hence the frequency of the signal, so as to produce two beams, as shown on the drawing, one of which is deflected and the other of which is not deflected. This effect is well known in the art of acousto-optic Bragg cells and the deflected beam is Doppler shifted in frequency.

Both beams of light are then transmitted along the light guide to a region indicated by the broken line 6, where an optical lens system is located. This serves to focus parts of the light which have been deflected by different amounts, or not deflected at all, into respective spatially separated parts of spatial light modulator 7.

The spatial light modulator 7 comprises a number of interdigitated electrodes, which lie across the light guide and which receive control signals from lines 7A. The control signals alter the potentials on the electrodes and hence vary the amount of light transmitted by the spatial light modulator 7 at different points along it by varying the refractive index of the block 3 because of its electro-optical properties.

The control signals can be adjusted to allow only light incident at a particular part or parts of the spatial light modulator 7 to pass. Thus the control signals may allow the passage of light having a fixed deflection angle or may be continuously altered to vary the angle of deflection of the light allowed through. The undeflected beam is, in this particular embodiment, always allowed to pass through the spatial light modulator 7.

The modulation of the deflected light output from the spatial light modulator 7 thus corresponds with the particular R.F. carrier which is selected by the control signals on line 7A.

This deflected light output is then coupled together with the undeflected light output from the light guide by a prism 8. These two outputs, which are of different frequencies because of the Doppler-effect referred to previously, are heterodyned together in a light detector 9 which produces an output consisting of the lower sideband resulting from the mixing process. This output carries any modulation of the particular band of input frequencies selected by the spatial modulator 7.

If there is modulation of the R.F. carrier, it may then be analysed if it is so desired.

The spatial light modulator employed may be of alternative design, for example as shown in FIGS. 2 and 3.

FIG. 2 shows an alternative spatial filter which could be used in an alternative embodiment of the invention. This is based on the principle of Mach Zehnder interferometer and comprises a large number (only three shown) of light guides 10, 11 and 12 with flared ends 10A, 10B, 11A, 11B, 12A, 12B. Each guide has a double portion formed by branches, e.g. as shown at 10C and 10D. Electrodes of one set, connected to an earthed terminal 13, lie between the double portions of adjacent pairs of guides and on the other side of the first and last guide. Electrodes such as shown at 14, 15, 16 are connected to a signal generating unit which applies voltages to selective electrodes 14, 15, 16 etc. This provides a potential gradient in the region of selected guides produced across one branch of a pair in one direction and in the opposite direction across the other branch of that pair. This increases the guided mode index in one branch and decreases it in the other. The signals in the branches are thus out of phase with each other, resulting in interference when they are recombined. Therefore, the amount of light passing through individual guides may be controlled.

FIG. 3 shows another alternative spatial filter. This is a so-called Δβ coupler in which potential differences applied between earthed electrodes 17, 18, 19 and 20 on the one hand and 21 and 22 on the other hand control the amount of light coupled from a light guide 23 to a light guide 24 and from a light guide 25 to a light guide 26.

The illustrated device offers the ability to provide rapidly agile R.F. filtering with arbitrary spectral shape which is particularly useful for frequency agile communications and radar systems permitting either limited bandwidth agile jamming signals to be excized or agile wanted signals to be adaptively filtered from wideband interference.

I claim:

1. A frequency selective filter for filtering an input signal, comprising: means for receiving such input signal; a device for deflecting a light beam by an amount dependent on the frequency of the input signal; a spatial light modulator having a light receiving region disposed to receive light from said device, said light receiving region extending in the direction in which light is deflected by said device; and means for applying control signals to the said spatial light modulator, for giving said modulator a light transmissivity which varies in the direction in which light is deflected by said device as a function of the value of said control signals, said spatial light modulator being arranged to receive the deflected light and to distinguish between light deflected through different angles by said device so that said modulator transmits light modulated in response to components of said input signal having a particular frequency characteristic defined by the said control signals.

2. A filter as claimed in claim 1 wherein said deflecting device comprises means for producing surface waves from the input signal and propagating the surface waves along the surface of a single piece of material, the device for deflecting a light beam and the spatial light modulator being formed on the said surface.

3. A filter as claimed in claim 2 and including focussing means for focussing the light beam after it has been deflected, formed as part of the single piece of material.

4. A filter as claimed in claim 3 and wherein the single piece of material comprises a lithium niobate substrate.

5. A filter as claimed in claim 1 wherein the input signal contains components at a plurality of different frequencies, and said control signals act on said modulator for causing said modulator to effectively transmit light which has been deflected by said device by at least one selected frequency of the input signal.

* * * * *